(12) United States Patent
Hui et al.

(10) Patent No.: US 8,093,646 B1
(45) Date of Patent: Jan. 10, 2012

(54) FLASH MEMORY DEVICE AND METHOD OF FORMING THE SAME WITH IMPROVED GATE BREAKDOWN AND ENDURANCE

(75) Inventors: Angela Hui, Fremont, CA (US); Yider Wu, Campbell, CA (US)

(73) Assignee: Spansion LLC, Sunnyvale, CA (US)

( * ) Notice: Subject to any disclaimer, the term of this patent is extended or adjusted under 35 U.S.C. 154(b) by 82 days.

(21) Appl. No.: 11/432,495

(22) Filed: May 12, 2006

Related U.S. Application Data

(62) Division of application No. 10/819,162, filed on Apr. 7, 2004, now Pat. No. 7,067,388.

(51) Int. Cl.
*H01L 29/788* (2006.01)

(52) U.S. Cl. .. 257/315; 257/316; 257/324; 257/E21.209

(58) Field of Classification Search .................. 257/315
See application file for complete search history.

(56) References Cited

U.S. PATENT DOCUMENTS

| | | | |
|---|---|---|---|
| 5,894,162 A * | 4/1999 | Paterson et al. | 257/316 |
| 6,114,204 A * | 9/2000 | Ding et al. | 438/264 |
| 6,232,635 B1 * | 5/2001 | Wang et al. | 257/318 |
| 6,436,767 B1 * | 8/2002 | Koishikawa | 438/265 |
| 6,605,506 B2 * | 8/2003 | Wu | 438/257 |
| 6,716,698 B1 * | 4/2004 | He et al. | 438/257 |
| 6,764,920 B1 | 7/2004 | Yang et al. | |
| 6,838,342 B1 | 1/2005 | Ding | |
| 6,911,370 B2 * | 6/2005 | Wang et al. | 438/315 |
| 7,026,683 B2 * | 4/2006 | Sonoda et al. | 257/315 |
| 7,416,939 B2 * | 8/2008 | Hendriks et al. | 438/257 |
| 2002/0000603 A1 * | 1/2002 | Sakakibara et al. | 257/315 |
| 2003/0119260 A1 * | 6/2003 | Kim et al. | 438/257 |
| 2005/0045944 A1 | 3/2005 | Gratz et al. | |

* cited by examiner

*Primary Examiner* — Kenneth Parker
*Assistant Examiner* — Jose R Diaz
(74) *Attorney, Agent, or Firm* — McDermott Will & Emery LLP

(57) ABSTRACT

The present invention provides a flash memory device and method for making the same having a floating gate structure with a semiconductor substrate and shallow trench isolation (STI) structure formed in the substrate. A first polysilicon layer is formed over the substrate and the STI structure. The recess formed within the first polysilicon layer is over the STI structure and extends through the first polysilicon layer to the STI structure. An oxide fill is provided within the recess and is etched back. ONO (oxide-nitride-oxide) layer conformally covers the oxide fill and the first polysilicon layer. The second polysilicon layer covers the ONO layer. The oxide fill within the recess provides a minimum spacing between the second polysilicon layer and the corner of the STI regions, thereby avoiding the creation of a weak spot and reducing the risk of gate breakdown, gate leakage, and improving device reliability.

10 Claims, 2 Drawing Sheets

FLASH MEMORY DEVICE AND METHOD OF FORMING THE SAME WITH IMPROVED GATE BREAKDOWN AND ENDURANCE

RELATED APPLICATIONS

This application is a divisional of U.S. patent application Ser. No. 10/819,162, filed Apr. 7, 2004, now U.S. Pat. No. 7,067,388, the contents of which are hereby incorporated by reference.

FIELD OF THE INVENTION

The present invention relates to flash memory devices and methods for making the same, and in particular to improving the gate breakdown and endurance of flash memory devices.

BACKGROUND OF THE INVENTION

Flash memory devices have found increasing use in all manners of electronic products. For example, flash memory devices are used in digital cameras, personal digital assistants (PDAs) and cellular telephones, to name just a few products. A cross-section of a portion of a flash memory device is depicted in prior art FIG. 1. The figure represents an idealized conventional floating gate structure. The floating gate structure includes a substrate 10 and shallow trench isolation regions 12 formed in the substrate 10. A first polysilicon layer 14 is formed over the substrate 10 and the shallow trench isolation regions 12. An oxide-nitride-oxide (ONO) layer 16 is formed over the STI regions 12 and the first polysilicon layer 14. A second polysilicon layer 18 is conformally deposited over the ONO layer 16.

The first polysilicon layer 14 is formed on the STI regions 12 with narrow spacings. The second polysilicon layer 18 fills the gap in the narrow space to form the floating gate structure. Referring now to FIG. 2, as the geometry of the floating gate structures becomes smaller, a mis-alignment margin for the first polysilicon layer becomes much smaller. The mis-alignment increases the chances that the second polysilicon layer 18 will contact the corner of the STI region 12, as indicated at reference numeral 20 in FIG. 2. Some of the problems created by the close contact of the second polysilicon layer 18 with the corner of the STI region 12 include decreased endurance, reduced gate breakdown voltage, and a potential weak spot for gate leakage concerns. With the push for continuously shrinking geometries and the limitations of lithography printing alignment margins, it is desirable to provide a flash memory device that overcomes the concerns potentially created by mis-alignment.

BRIEF DESCRIPTION OF THE DRAWINGS

These and other needs are met by embodiments of the present invention which provide a flash memory device having a floating gate structure, comprising a semiconductor substrate and a shallow trench isolation (STI) structure formed in the substrate. A first polysilicon layer is provided over the substrate and the STI structure. A recess is formed within the first polysilicon layer over the STI structure and extends through the first polysilicon layer to the STI structure. Oxide fill is provided within the recess, and an oxide-nitride-oxide (ONO) layer conformally covers the oxide fill and the first polysilicon layer. A second polysilicon layer covers the ONO layer.

The oxide fill within the recess, in accordance with embodiments of the present invention, increases the distance between the second polysilicon layer and the source/drain silicon at the corner of the STI region. Hence, a mis-alignment will not create the problems of endurance, potential weak spots for gate leakage and low gate breakdown voltage as in conventional memory structures.

The earlier stated needs are also met by embodiments of the present invention which provide a method of forming a floating gate transistor comprising the steps of forming a shallow trench isolation (STI) and first polysilicon layer in an arrangement with recesses. Dielectric spacer material is formed in the bottom of the recesses. An oxide-nitride-oxide (ONO) layer is formed on the dielectric spacer material and the first polysilicon layer. A second polysilicon layer is then formed on the ONO layer.

In other embodiments of the invention, a method of forming a flash memory device is provided comprising the steps of forming the first polysilicon layer over a substrate having a STI region. A recess is etched in the first polysilicon layer over the STI region, the recess extending at least to the STI region. Oxide is deposited in the recess, and an ONO layer is formed over the oxide and the recess and over the first polysilicon layer. The second polysilicon layer is then formed on the ONO layer.

The foregoing and other features, aspects and advantages of the present invention will become more apparent from the following detailed description of the present invention when taken in conjunction with the accompany drawings.

BRIEF DESCRIPTION OF THE DRAWINGS

Figure 1:
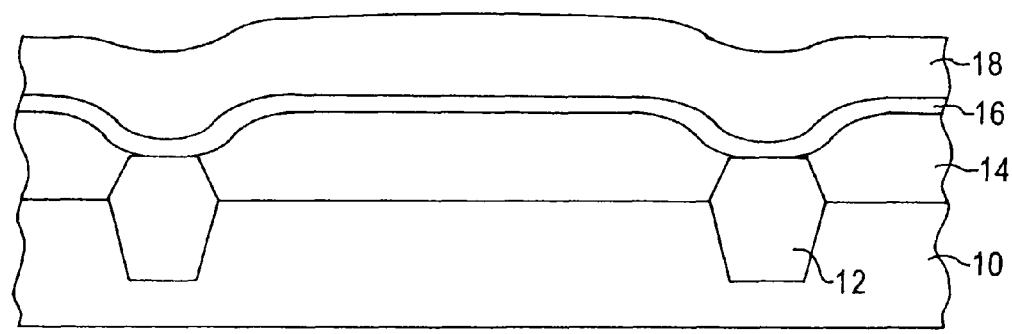

FIG. 1 is a schematic depiction of a cross-section of a portion of a flash memory device constructed with the prior art and having an idealized alignment of the recesses in the first polysilicon layer to the STI regions.

Figure 2:
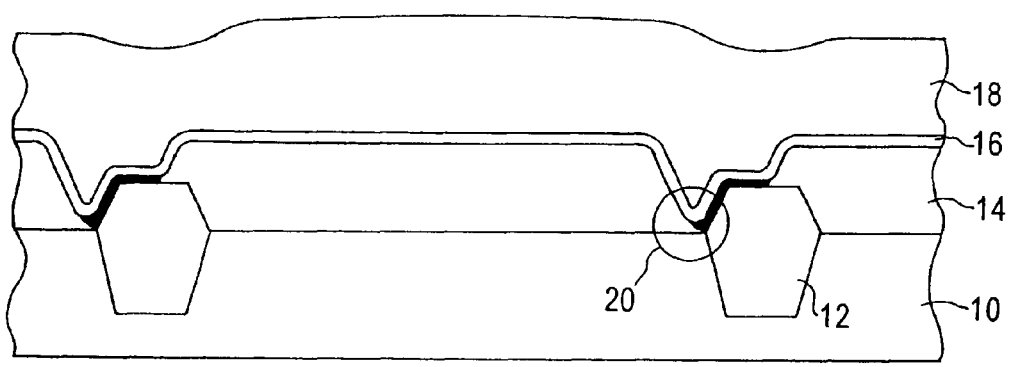

FIG. 2 depicts the conventional floating structure in which the alignment of the recesses first polysilicon layer is slightly mis-aligned with respect to the STI region as may occur in actual practice according to methods of the prior art.

Figure 3:
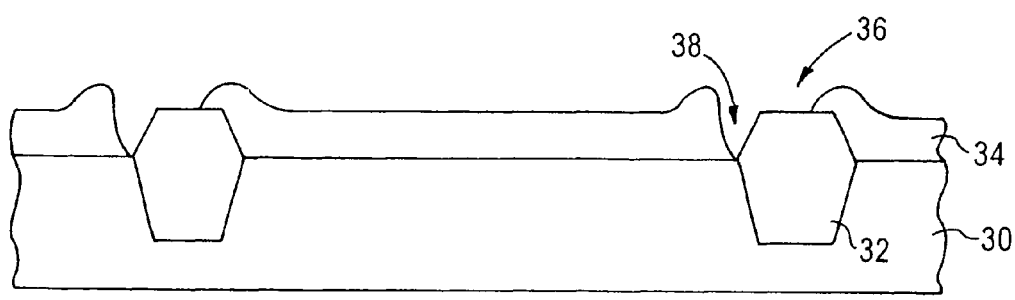

FIG. 3 depicts the precursor of the present invention, in which a mis-alignment has occurred with formation of the first polysilicon layer.

Figure 4:
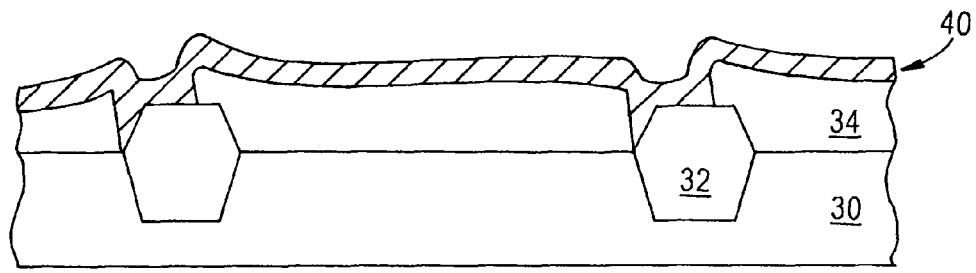

FIG. 4 shows the structure of FIG. 3 following the filling of the gates with dielectric material in accordance with embodiments of the present invention.

Figure 5:
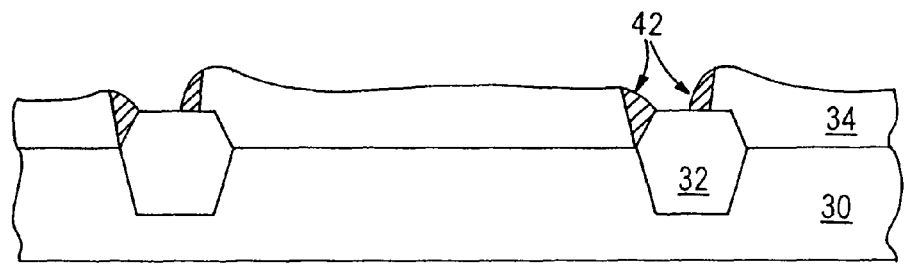

FIG. 5 depicts the structure of FIG. 4 after a blanket etch back of the dielectric material in accordance with embodiments of the present invention.

Figure 6:
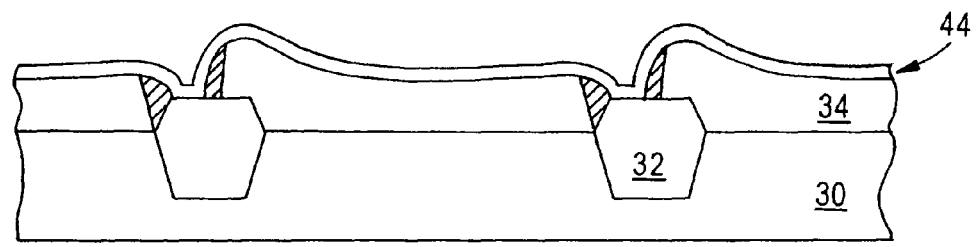

FIG. 6 depicts the structure of FIG. 5 following the formation of an oxide-nitride-oxide (ONO) layer, in accordance with embodiments of the present invention.

Figure 7:
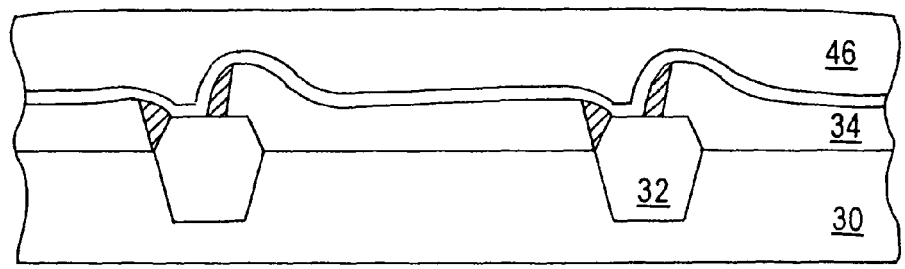

FIG. 7 shows the structure of FIG. 6 after deposition of second polysilicon layer over the ONO layer, in accordance with embodiments of the present invention.

DETAILED DESCRIPTION OF THE INVENTION

The present invention addresses and solves problems related to the potential mis-alignment in the lithographic printing of a first polysilicon layer to a shallow trench isolation region in the flash memory device. Mis-alignment problems create concerns such as endurance, potential weak spots for gate leakage, and low gate breakdown voltage. The invention solves these problems, in part, by providing a dielectric film material, such as an oxide, within the recesses formed in the polysilicon layer over the shallow trench isolation regions. The dielectric spacer material, such as an oxide, remains inside the narrow spaces within the polysilicon layer and increases the distance between the second polysilicon layer to source/drain regions of the silicon. Hence, even if there is a mis-alignment in the narrow spaces of the first polysilicon layer, there is a minimum distance that will be provided between the second polysilicon layer and the underlying silicon.

FIG. 3 depicts a precursor constructed in accordance with conventional technology having a substrate 30 and STI regions 32 within the substrate 30. A first polysilicon layer 34 is formed over the STI regions 32 and the substrate 30. A recess 36 (the narrow spaces) are formed within the first polysilicon layer 34 by conventional lithographic printing techniques. However, as can be appreciated by FIG. 3, a mis-alignment has occurred so that a dip 38 is present that extends to the corner of the STI region 32 with the substrate 30. With ever-shrinking geometries, such mis-alignments are common due to the margins of the lithographic printing alignment of the first polysilicon layer 34 to the STI regions 32 becoming tighter and tighter.

In order to overcome these concerns, as depicted in FIG. 4, a gate fill is performed to deposit dielectric spacer material 40 within the recesses 36 (narrow spaces) in the first polysilicon layer 34. In certain preferred embodiments, the dielectric spacer material 40 is an oxide. Other materials may be employed without departing from the spirit or scope of the present invention. The oxide 40 is formed by a conventional deposition technique, such as CVD, although the invention is not limited to this methodology.

Following the deposition of the dielectric spacer material 40, a blanket etch back is performed, the results of which are depicted in FIG. 5. The blanket etch back creates dielectric spacer material 42 at the bottom of the recesses 36 in the first polysilicon layer 34. A controllable amount of dielectric spacer material 42 remains inside the recess 36. For example, at least 10% of the recess 36 may be filled with the dielectric spacer material 42. When the first polysilicon layer 34 is between about 400 to about 1200 Å, for example, the thickness of the dielectric spacer material may be between about 40 to about 120 Å, as an example. However, these thicknesses are exemplary only, and a greater thickness of the dielectric spacer material 42 may be employed in certain preferred embodiments of the invention. It is desired that a minimum amount of dielectric spacer material 42 remain in the recess, to provide a minimum spacing between the second polysilicon layer that will be deposited and the source/drain silicon regions.

A conventional etching technique may be performed to blanket etch back the dielectric spacer material 42. For example, when the dielectric spacer material 42 is an oxide, a buffered oxide etch will selectively etch the oxide in the dielectric spacer material 42 without substantially etching the first polysilicon layer 34 or the silicon substrate 30. Timing of the buffered oxide etch provides a desired control in the blanket etch back of the dielectric spacer material 42.

An ONO layer 44 is then deposited, as depicted in FIG. 6 over the first polysilicon layer 34 and the dielectric spacer material 42. A conventional technique may be employed to deposit the ONO layer 44. The ONO layer 44 serves as a charge trapping dielectric layer and may be formed in a conventional manner.

Following the formation of the ONO layer depicted in FIG. 6, a second polysilicon layer 46 is deposited on the ONO layer 44, as depicted in FIG. 7. A conventional methodology may be employed to deposit the second polysilicon layer 46.

As will be appreciated from FIG. 7, the polysilicon layer 46 is separated from the silicon 30 at the corner of the STI region 32 by an amount equal to the thickness of the dielectric spacer material 42 in the recesses 36. This minimum spacing between the second polysilicon layer 46 and the source/drain silicon regions in the substrate 30 prevents contact of the second polysilicon layer with the source/drain regions of the silicon. This has a positive effect on the endurance, prevents a potential weak spot for gate leakage from being created, and also prevents a low gate breakdown voltage of the flash memory device. This is achieved even in instances where the lithographic printing alignment margin of the first polysilicon layer to the shallow trench isolation regions is very small, and the printing is mis-aligned. The present invention thus provides increased device reliability.

Though the present invention has been described and illustrated in detail, it is to be clearly understood that the same is by way of illustration and example only and is not to be taken by way of limitation, the scope of the present invention being limited only by the terms of the appended claims.

What is claimed is:

1. A flash memory device having a floating gate structure, comprising:
   a semiconductor substrate;
   a shallow trench isolation (STI) structure formed in the substrate;
   a first polysilicon layer over the substrate and the STI structure;
   a recess formed within the first polysilicon layer over the STI structure and extending through the first polysilicon layer to the STI structure;
   oxide fill only within the recess;
   an oxide-nitride-oxide (ONO) layer conformally covering the oxide fill and the first polysilicon layer, a portion of the ONO layer being formed within the recess, wherein the ONO layer is in direct physical contact with the STI structure; and
   a second polysilicon layer covering the ONO layer, a portion of the second polysilicon layer being formed within the recess.

2. The device of claim 1, wherein the first polysilicon layer is between about 400 Å to about 1200 Å thick.

3. The device of claim 2, wherein the oxide fill is at least 100 Å thick.

4. The device according to claim 1, wherein the first polysilicon layer is misaligned with respect to an upper surface of the STI structure.

5. The device according to claim 1, wherein the recess extends to the substrate.

6. The device according to claim 1, further comprising spaced apart source/drain regions in the substrate adjoining the STI structure.

7. The device according to claim 6, wherein the second polysilicon layer is separated from a source/drain region at a corner of the STI structure by an amount equal to a thickness of the oxide fill.

8. The device according to claim 1, wherein the oxide fill occupies at least 10% of the recess.

9. The device according to claim 1, wherein the oxide fill is in the form of spacers.

10. The device of claim 1, wherein a width of the recess is equal to or less than a width of the STI structure.

* * * * *